US 10,192,950 B2

(12) United States Patent
Jung et al.

(10) Patent No.: US 10,192,950 B2
(45) Date of Patent: Jan. 29, 2019

(54) DISPLAY MODULE AND MULTI-DISPLAY DEVICE INCLUDING THE SAME

(71) Applicant: SAMSUNG ELECTRONICS CO., LTD., Suwon-si (KR)

(72) Inventors: Jong-hoon Jung, Suwon-si (KR); Dae-sik Kim, Hwaseong-si (KR); Young-mok Park, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 158 days.

(21) Appl. No.: 14/854,128

(22) Filed: Sep. 15, 2015

(65) Prior Publication Data

US 2016/0197134 A1 Jul. 7, 2016

Related U.S. Application Data

(60) Provisional application No. 62/100,174, filed on Jan. 6, 2015.

(30) Foreign Application Priority Data

Apr. 7, 2015 (KR) .......................... 10-2015-0049014

(51) Int. Cl.
*H01L 27/32* (2006.01)
*G02F 1/1368* (2006.01)
(Continued)

(52) U.S. Cl.
CPC ........ *H01L 27/3293* (2013.01); *G02F 1/1368* (2013.01); *G02F 1/13452* (2013.01);
(Continued)

(58) Field of Classification Search
CPC .................................................. H01L 27/3293
See application file for complete search history.

(56) References Cited

U.S. PATENT DOCUMENTS 6,524,877 B1 * 2/2003 Nakazawa .............. H01L 27/12
257/40
8,482,480 B2 7/2013 Kim et al.
(Continued)

FOREIGN PATENT DOCUMENTS

CN 103296017 A 9/2013
KR 10-2010-0003652 A 1/2010
(Continued)

OTHER PUBLICATIONS

English translation of CN103296017, Yang et al., 2013.*
(Continued)

*Primary Examiner* — Lex Malsawma
*Assistant Examiner* — Xia Cross
(74) *Attorney, Agent, or Firm* — Sughrue Mion, PLLC

(57) ABSTRACT

A display module is provided including a pixel region having a plurality of pixels and a black matrix arranged outside the pixel region. Each of the pixels is separated from adjacent pixels by a first interval, a left distance from the left edge to a first one of the plurality of pixels plus a right distance from a second one of the plurality of pixels to the right edge is a first distance, and a bottom distance from the bottom edge to a third one of the plurality of pixels plus a top distance from a fourth one of the plurality of pixels to the top edge is the first distance.

21 Claims, 15 Drawing Sheets

(51) Int. Cl.
  *G02F 1/1335* (2006.01)
  *G02F 1/1345* (2006.01)
  *H01L 51/52* (2006.01)

(52) U.S. Cl.
  CPC .... *G02F 1/133512* (2013.01); *H01L 27/3218* (2013.01); *H01L 27/3251* (2013.01); *H01L 51/5284* (2013.01)

(56) References Cited

U.S. PATENT DOCUMENTS

| | | | |
|---|---|---|---|
| 2001/0017372 A1* | 8/2001 | Koyama | G02F 1/136286 257/72 |
| 2005/0140569 A1 | 6/2005 | Sundahl | |
| 2007/0000849 A1 | 1/2007 | Lutz et al. | |
| 2008/0024714 A1 | 1/2008 | Park | |
| 2008/0174515 A1* | 7/2008 | Matthies | G02F 1/13336 345/1.3 |
| 2009/0284904 A1* | 11/2009 | Wu | G02F 1/133305 361/679.01 |
| 2010/0001925 A1 | 1/2010 | Kim et al. | |
| 2010/0129073 A1* | 5/2010 | Hamana | H04B 10/801 398/25 |
| 2013/0044074 A1* | 2/2013 | Park | G02F 1/13338 345/174 |
| 2014/0063393 A1* | 3/2014 | Zhong | G02F 1/13306 349/42 |
| 2014/0085250 A1 | 3/2014 | Cok | |
| 2014/0138643 A1 | 5/2014 | Choi et al. | |
| 2014/0184984 A1* | 7/2014 | Kim | G02F 1/1334 349/61 |

FOREIGN PATENT DOCUMENTS

| | | |
|---|---|---|
| KR | 10-1219198 B1 | 1/2013 |
| KR | 10-2013-0022802 A | 3/2013 |
| KR | 10-2014-0064131 A | 5/2014 |
| KR | 10-2014-0072422 A | 6/2014 |
| WO | 2007/054947 A2 | 5/2007 |

OTHER PUBLICATIONS

International Search Report for PCT/KR2015/014152 dated Mar. 30, 2016 [PCT/ISA/210].
Written Opinion for PCT/KR2015/014152 dated Mar. 30, 2016 [PCT/ISA/237].
Communication issued by the European Patent Office dated Oct. 20, 2017 in counterpart European Patent Application No. 15877204.6.

* cited by examiner

DISPLAY MODULE AND MULTI-DISPLAY DEVICE INCLUDING THE SAME

PRIORITY

This application claims priority from Korean Patent Application No. 10-2015-0049014 filed on Apr. 7, 2015 in the Korean Intellectual Property Office, and the benefit of U.S. Provisional Patent Application No. 62/100,174 filed on Jan. 6, 2015 in the U.S. Patent and Trademark Office, the disclosures of which are incorporated herein by reference.

BACKGROUND

1. Field

Methods and apparatuses consistent with exemplary embodiments relate to a display module and a multi-display device including the same, and to a display module that does not have a bezel and a multi-display device that includes display modules bonded to one another.

2. Description of Related Art

Recently, various display devices have been developed to implement a single multi-display device using a plurality of display modules.

A multi-display device implements one large screen by combining multiple display modules, and may be used in an exhibition hall or for an electronic signboard.

According to the display module in the related art, a flexible circuit board and a driver integrated circuit (IC) are arranged on an upper side of a lower panel in the display module, and a top chassis is added to hide them. Through this configuration, the display module is divided into a display region and a non-display region, and the non-display region is covered using a bezel. Accordingly, when a multi-display device is created through bonding of multiple display modules, due to the bezel between the display modules, a displayed image is divided.

To resolve such drawbacks, end portions of the respective display modules may be integrated in a lamination, or a bezel portion size may be made reduced. Further, to eliminate joints during bonding of the respective display modules, an optical element may be arranged on an upper part of the bezel portion to cover the bezel.

However, because such configurations require appropriate distances from a monitor for visibility, complete visibility is not possible, and resolution of the optical element portion is deteriorated in comparison to resolution of the display region.

Further, a light-emitting diode (LED) multi-display device in the related art forms a module type large screen using a plurality of LEDs arranged in a matrix. However, such a configuration has the drawbacks that it has a complicated structure and consumes a large amount of power in comparison to an existing liquid-crystal display (LCD) or organic light-emitting diode (OLED) display. Further, such a configuration has low resolution and a viewer must maintain a predetermined distance from the display screen.

SUMMARY

The present disclosure has been made to address at least the above needs and to provide at least the advantages described below, and an aspect of the present disclosure provides a display module having no bezel and a multi-display device using the same, which can improve visibility and resolution through making a gap between unit pixels of an edge portion equal to a gap between unit pixels of a pixel region during bonding of a plurality of display modules.

According to an aspect of an exemplary embodiment, there is provided a display module having a rectangular shape having a left edge, a right edge, a top edge and a bottom edge, the display module including: a pixel region comprising a plurality of pixels; and a black matrix arranged outside the pixel region. Each of the plurality of pixels is separated from corresponding adjacent pixels by a first distance, a left distance from the left edge to a first one of the plurality of pixels plus a right distance from a second one of the plurality of pixels to the right edge is the first distance, and a bottom distance from the bottom edge to a third one of the plurality of pixels plus a top distance from a fourth one of the plurality of pixels to the top edge is the first distance.

The left distance, the right distance, the bottom distance and top distance may be equal to each other.

The left and the right distances may be the same, the bottom and the top distances may be different.

The bottom and the top distances may be the same, and the left and the right distances may be different.

At least one of the left distance, the right distance, the bottom distance and the top distance may be zero.

The left distance and the right distance may be different.

The bottom distance and the top distance may be different, and a remaining pair of distances may be different.

Two distances of the left distance, the right distance, the bottom distance and the top distance may be zero.

The left distance may be zero.

Each of the left distance, the right distance, the bottom distance and the top distance may be different.

One of the left distance, the right distance, the bottom distance and the top distance may be zero.

According to an aspect of another exemplary embodiment, there is provided a display module including: a first panel having a pixel region in which a plurality of pixels, are provided and a black matrix arranged outside the pixel region; a second panel arranged on a lower side of the first panel, the second panel having a plurality of thin film transistors; and a semiconductor device disposed on a flexible circuit board, the flexible circuit board being electrically connected to one side of the second panel. Each of the plurality of pixels is separated from corresponding adjacent pixels by a first distance, the display module has a first edge portion, a second edge portion, a third edge portion and a fourth edge portion, a left distance from the left edge to a first one of the plurality of pixels plus a right distance from a second one of the plurality of pixels to the right edge is the first distance, and a bottom distance from the bottom edge to a third one of the plurality of pixels plus a top distance from a fourth one of the plurality of pixels to the top edge is the first distance.

The display module may further include at least one of a liquid crystal layer and an organic light emitting diode (OLED) layer arranged on a lower side of the second panel.

A surface of the flexible circuit board may face a direction perpendicular to a direction of the first panel.

A size of the flexible circuit board may correspond to a width of the black matrix.

The display module may further include an opaque fixing member joining the flexible circuit board to the second panel.

The display module may further include a compensation circuit disposed on the flexible circuit board.

The display module may further include a protection glass arranged on a lower surface of the liquid crystal layer; and a compensation circuit on one side of the semiconductor device.

The display module may further include a liquid crystal layer formed by coating a lower surface of the second panel with capsule-shaped nano-liquid crystals; and a compensation circuit disposed on the flexible circuit board.

The display module may further include a liquid crystal layer; and a backlight arranged on a lower side of the liquid crystal layer. The backlight may be of a direct type or an edge type.

According to an aspect of yet another exemplary embodiment, there is provided a multi-display device including a plurality of display modules bonded to each other, each of the plurality of display modules including: a first panel having a pixel region in which a plurality of pixels are provided and a black matrix arranged outside the pixel region; and a second panel arranged on a lower side of the first panel, the second panel having a plurality of thin film transistors. Each of the pixels is separated from corresponding adjacent pixels by a first distance, each of the plurality of display modules comprises a first edge portion, a second edge portion, a third edge portion and a fourth edge portion, a left distance from the left edge to a first one of the plurality of pixels plus a right distance from a second one of the plurality of pixels to the right edge is the first distance, and a bottom distance from the bottom edge to a third one of the plurality of pixels plus a top distance from a fourth one of the plurality of pixels to the top edge is the first distance.

The plurality of display modules may form a curve.

According to an aspect of still another exemplary embodiment, there is provided a rectangular display module having a left edge, a right edge, a top edge and a bottom edge, the display module including: a pixel; and a black matrix arranged around the pixel, wherein a left distance from the left edge to the pixel plus a right distance from the pixel to the right edge is a first distance, and wherein a bottom distance from the bottom edge to the pixel plus a top distance from the pixel to the top edge is the first distance.

The left, right, top and bottom edges may be attachable to another display module.

At least one of the left distance, the right distance, the top distance and the bottom distance may be zero.

At least two of the left distance, the right distance, the top distance and the bottom distance may be zero.

The left distance, the right distance, the top distance and the bottom distance may all be different distances.

According to an aspect of another exemplary embodiment, there is provided a rectangular display module having a left edge, a right edge, a top edge and a bottom edge, the display module including: a first pixel arranged in a bottom left corner of the display module separated from a left edge by a left distance and a bottom edge by a bottom distance; a second pixel arranged in a top left corner of the display module separated from the left edge by the left distance, the top edge by a top distance and the first pixel by a first distance; a third pixel arranged in a bottom right corner of the display module separated from the first pixel by the first distance, the bottom edge by the bottom distance and the right edge by a right distance; and a fourth pixel arranged in a top right corner of the display module separated from the third pixel by the first distance, the second pixel by the first distance, the top edge by the top distance and the right edge by the right distance, wherein a horizontal sum of the left distance and the right difference is equal to the first distance, and a vertical sum of the top distance and the bottom distance is equal to the first distance.

BRIEF DESCRIPTION OF THE DRAWINGS

The above and other aspects, will become more apparent from the following detailed description, taken in conjunction with the accompanying drawings, in which.

DETAILED DESCRIPTION OF EXEMPLARY EMBODIMENTS

Figure 1A:
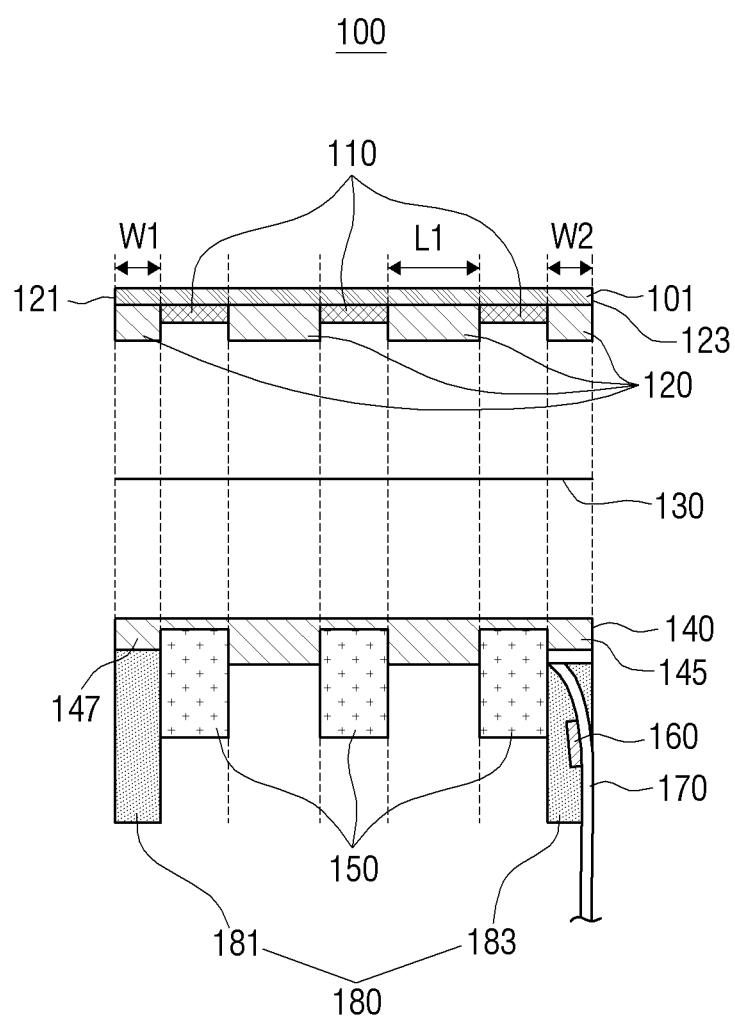
FIG. 1A is a schematic side view illustrating a display module according to an exemplary embodiment.

Exemplary embodiments may be diversely modified. Accordingly, exemplary embodiments are illustrated in the drawings and are described in detail. However, it is to be understood that the present disclosure is not limited to the specific exemplary embodiments described herein, but includes all modifications, equivalents, and substitutions, without departing from the scope and spirit of the present disclosure. Also, well-known functions or constructions may not be described in detail because they would obscure the disclosure with unnecessary detail. Expressions such as "at least one of," when preceding a list of elements, modify the entire list of elements and do not modify the individual elements of the list.

The terms "first", ""second"," etc. may be used to describe diverse components, but the components are not limited by the terms. The terms are only used to distinguish one component from another.

Hereinafter, a display module and a multi-display device including display modules bonded to each other according to exemplary embodiments will be described in detail, with reference to the accompanying drawings.

FIG. 1A is a schematic side view illustrating a display module according to a first exemplary embodiment. The display module according to the first exemplary embodiment may be a display module of an OLED (Organic Light Emitting Diodes) display.

The OLED display is a display configured using a self-luminous organic material which emits light due to an electroluminescence phenomenon wherein a fluorescent organic compound emits light if current flows therethrough. An organic electroluminescent element may be a self-luminous element in which a light emitting layer is formed between two electrodes. The organic electroluminescent element emits light in a manner that electrons and holes, which are injected from an electron injection electrode and a hole injection electrode into the light emitting layer, are recombined in the light emitting layer to generate excitons, and as the generated excitons transition from an excited state to a ground state, the light emitting layer emits light.

Hereinafter, an exemplary embodiment will be described with reference to FIG. 1A that is a schematic side view illustrating an exemplary configuration of an OLED display.

Referring to FIG. 1A, a display module 100 includes a first panel 101, a pixel region 110, a black matrix 120, an adhesive layer 130, a second panel 140, an organic light emitting diode 150, a semiconductor device 160, a flexible circuit board 170, and an opaque fixing portion 180.

The first panel 101 has a rectangular shape, and is arranged on a front surface of the display module 100. The first panel 101 may be made of a rigid or flexible material, such as glass polyether sulfone (PES), polyethylene terephthalate (PET), polyethylene naphthalate (PEN), polyimide (PI), and polycarbonate (PC), but is not limited thereto. Further, the first panel 101 may be an organic-inorganic composite layer composed of an organic material and an inorganic material. On the first panel 101, a polarizing plate, the pixel region 110, and the black matrix 120 are formed. The pixel region 110 and the black matrix 120 will be described in detail with reference to FIG. 1B.

The black matrix 120 and the pixel region 110 are alternately arranged. The width W1 of a segment of the black matrix 120 of a first edge portion 121 corresponds to ½ of a first interval L1, and the width W2 of the black matrix 120 of a second edge portion 123 is equal to ½ of the first interval L1.

Through this structure, when a plurality of display modules 100 are bonded, an interval between the pixels 110 across a bonded portion of the display modules 100 is equal to an interval between the pixels 110 in top, bottom, left, and right directions in one display module 100. Further, components, such as the organic light emitting diode 150 and the semiconductor device 160, which exist on the second panel 140, are hidden by the black matrix 120, and thus are not seen from the front of the display module 100.

In the present disclosure, four directions of the respective pixels 110 are referred to as top, bottom, left, and right directions. However, according to circumstances, it is also possible to replace "top" and "bottom" of the pixels 110 by "front" and "rear," respectively, and four directions of the pixels 110 are referred to as front, rear, left, and right directions.

The adhesive layer 130 laminates and affixes the first panel 101 and the second panel 140 to each other by adhering the first panel 101 and the second panel 140 to each other. The adhesive layer 130 may be an OCA (Optical Clear Adhesive) film, but is not limited thereto. It is also possible to attach the respective panels 101 and 104 to each other without using the OCA film.

The second panel 140 is made of thin film transistor glass, and includes a thin film transistor array TFT, data lines, and gate lines, which are provided on a substrate having similar material as the material of the first panel 101. The thin film transistor array may be formed in various forms depending on the structure of the transistor.

The organic light emitting diode 150 is arranged on the lower side of the second panel 140, and the flexible circuit board 670, on which the semiconductor device 160 is mounted, is electrically connected to one side of a lower portion of the second panel 140.

The organic light emitting diode 150 is arranged on the lower side of the second panel 140 as an OLED layer. The organic light emitting diode 150 includes a lower electrode, a light emitting layer, and an upper electrode. The lower electrode is connected to a source electrode or a drain electrode of a driving transistor of the thin film transistor array TFT. The upper electrode is connected to a high-level voltage or a low-level voltage. The light emitting layer is formed between the lower electrode and the upper electrode. The light emitting layer emits light. The light emitting layer that is included in a red sub-pixel emits red light, the light emitting layer that is included in a green sub-pixel emits green light, and the light emitting layer that is included in a blue sub-pixel emits blue light.

The thin film transistor array TFT and the organic light emitting diode 150 may be formed in various shapes depending on their structures. However, in the present disclosure, they are illustrated as blocks for convenience in explanation.

The semiconductor device 160 is mounted on the flexible circuit board 170 as a driver IC, and may be composed of a source driver IC or a gate driver IC.

The semiconductor device (driver IC) 160 is bent rearward together with the flexible circuit board 170. In this case, the second panel 140 has four end portions, and the flexible circuit board 170 or the driver IC 160 may be connected to any one of the four end portions. In this case, any one of the end portions may be equal to or larger than the width of the edge portion of the corresponding first panel 101. In FIG. 1A, the width of a right end 145 of the second panel 140, that corresponds to the width W2 of the black matrix 120 of the first panel 101, is equal to or larger than the width W2 of the black matrix 120.

The flexible circuit board 170 may be a flexible film type substrate or a flexible film, such as a COF (Chip On Film) or a TCP (Tapered Carrier Film), on which an electrode pattern or the driver IC 160 is formed. In addition to the COF or TCP, any other flexible film on which an electrode pattern may be formed may be used for the flexible circuit board.

The flexible circuit board 170 is mounted with the semiconductor device (driver IC) 160, and connects the second panel 140 and a printed circuit board to each other. The flexible circuit board 170 may be variously arranged depending on the structure of the display. The flexible circuit board 170 is connected to the right portion of the second panel 140, i.e., the right end 145 of the second panel 140 that corresponds to the width W2 of the black matrix 120, to be connected to the printed circuit board. However, it is also possible for the flexible circuit board 170 to be connected to a left end 147 of the second panel 140.

The opaque fixing portion 180 is formed to extend from the left end 147 and the right end 145 of the second panel 140 to lower sides. In general, the opaque fixing portion 180 is for adhesion between films made of a material for display and for adhesion between an optical mechanism and a film. The opaque fixing portion 180 supports and affixes the semiconductor device (driver IC) 160 and the flexible circuit board 170 to the second panel 140 to prevent light leakage from the end portion of the second panel 140 to the side thereof. Accordingly, the opaque fixing portion 180 may be made of a sealant 180 of a black material using black pigments or dyes, but is not limited thereto. Any configuration can be used so far as it can prevent the light leakage, and affix and support the semiconductor device (driver IC) 160 and the flexible circuit board 170.

The semiconductor device (driver IC) 160 and the flexible circuit board 170 are arranged to correspond to the width W2 of the black matrix 120 of the first panel 101 to be hidden by the black matrix 120. Accordingly, in the case where the widths of the left and right ends 145 and 147 of the second panel 140 correspond to ½ of the width W1 between the respective pixels 110, the opaque fixing portion 181 and 183 can be spread on the left and right ends 145 and 147 with the corresponding width. However, even in the case where the left and right ends 145 and 147 have a predetermined width that is different from the above-described width, it is possible to spread the opaque fixing portion 180 with the corresponding width to prevent the light leakage, or to affix and support the driver IC 160 and the flexible circuit board 170.

According to the display module in the related art, the respective configurations of the second panel are directed to the first panel, and the flexible circuit board is attached to face the first panel. In this structure, a bezel for hiding the flexible circuit board and the driver IC attached thereto is necessary.

According to the display module 100 the organic light emitting diode 150 attached to the second panel 140, the driver IC 160, the flexible circuit board 170, and wirings are not directed to the first panel 101, but are arranged in an opposite direction of the first panel 101. Accordingly, the driver IC 160 and the flexible circuit board 170 are hidden by the black matrix 120 of the edge portion 123 of the first panel 101, and thus the bezel is not necessary.

Further, because the first panel 101 and the second panel 140 are fixed by the adhesive layer 130, the display module 100 can be stably supported with predetermined strength and stiffness.

In the case of a large-scale display device implemented through connecting several display modules, as the width of the bezel becomes large, images are cut off by the bezel to cause shape distortion of the images to occur. Because the configuration does not have the bezel, the above-described problem can be basically solved. That is, it is possible to prevent the distortion of the screen and to implement a light-weighted, thin, short and small display module.

Figure 1B:
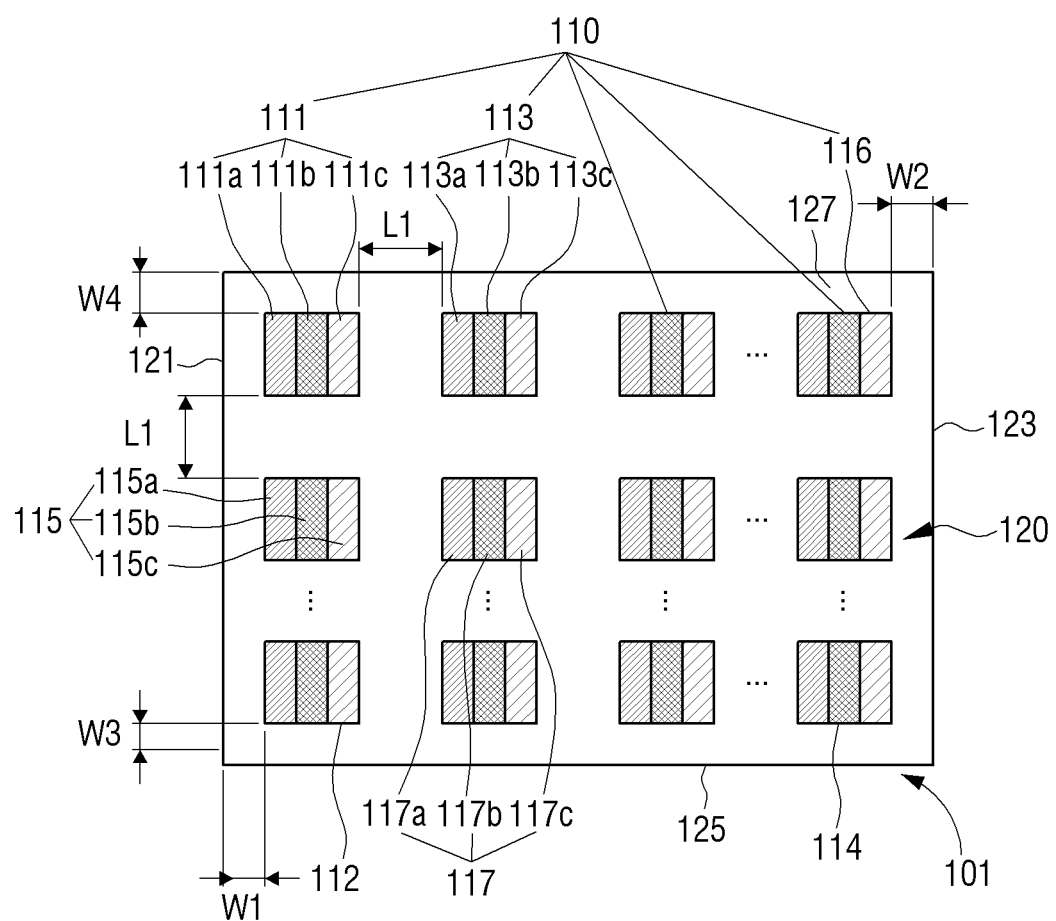
FIG. 1B is a plan view illustrating an example of a black matrix of a display module according to an exemplary embodiment.
Figure 2:
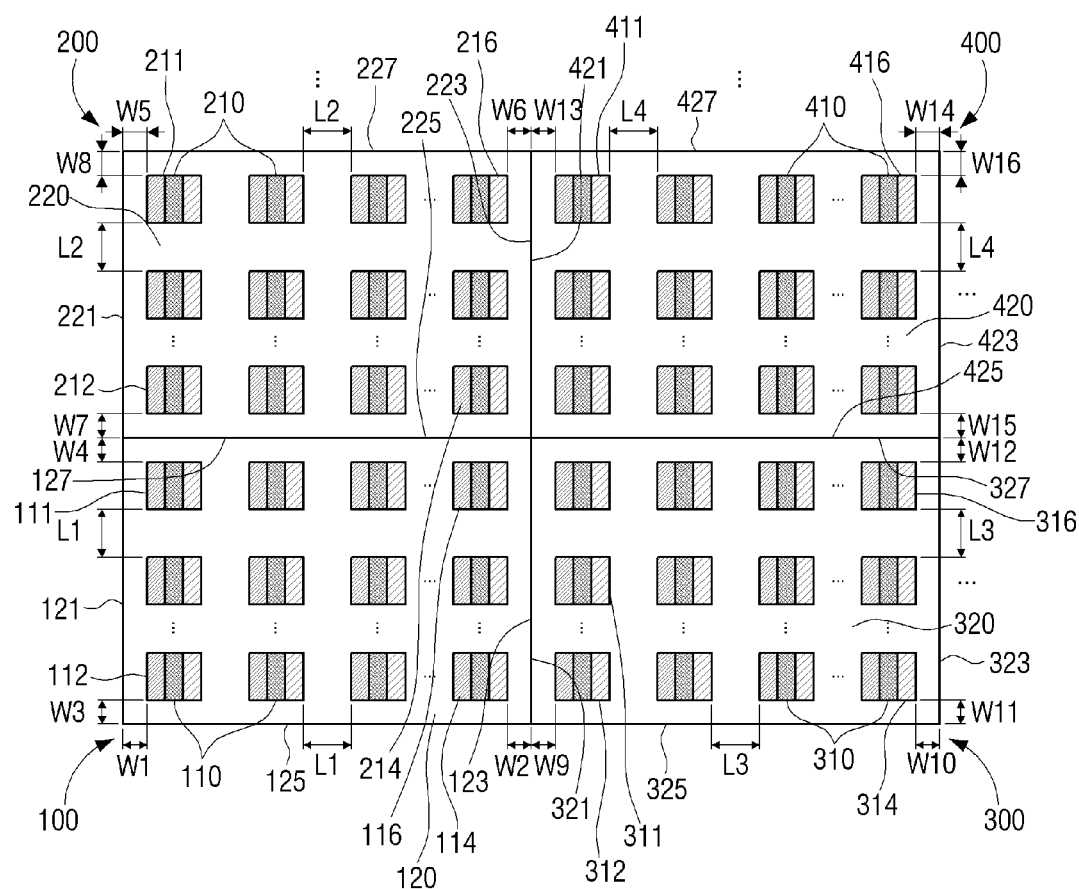
FIG. 2 is a view illustrating a multi-display device formed through bonding a plurality of display modules according to an exemplary embodiment.

FIG. 1B is a plan view illustrating a first example of a black matrix of a display module according to a first exemplary embodiment, and FIG. 2 is a view illustrating an example of a multi-display device that is formed through bonding of a plurality of display modules according to a first exemplary embodiment. FIG. 1B illustrates a configuration that corresponds to an arrangement of the pixel region 110 and the black matrix 120 of the first panel 101 of FIG. 1A.

Referring to FIGS. 1B and 2, the first panel 101 of the display module 100 includes the pixel region 110 and the black matrix 120 that is arranged not to hide the pixel region 110.

The pixel region 110 includes a plurality of pixels 111, 113, 115, and 117. The pixel 111 includes a red sub-pixel 111a that emits red light, a green sub-pixel 111b that emits green light, and a blue sub-pixel 111c that emits blue light. The respective pixels 111, 113, 115, and 117 are in a rectangular shape, are arranged in the form of a matrix, and are arranged at a first interval L1 with the top, bottom, left, and right adjacent pixels 111, 113, 115, and 117.

The sub-pixels 111a, 111b, and 111c may be variously configured depending on their structure. For convenience in explanation, it is exemplified that the sub-pixels 111a, 111b, and 111c are color filters.

Any one pixel 111 among the pixels 111, 113, 115, and 117 will be described in detail as an example. The pixel 111 includes the first sub-pixel 111a, the second sub-pixel 111b, and the third sub-pixel 111c, and may be formed on an inner surface of the first panel 101, or on a portion that corresponds to the pixel. The pixel 111 may be made of red, green, and blue pigments and resin.

The respective pixels 111, 113, 115, and 117 that are composed of color filters may be classified into a pigment type and a dye type depending on their material being used, and may be classified into dyeing, dispersion, electrophoretic deposition, and printing methods, depending on their manufacturing method. For example, the pigment dispersion method forms RGB color filter patterns after depositing the black matrix 120 through sputtering.

According to an exemplary embodiment, the black matrix 120 is not provided between the respective sub-pixels 111a, 111b, and 111c. However, it is also possible to form the black matrix 120 at a predetermined interval between the respective sub-pixels 111a, 111b, and 111c.

The black matrix 120 is formed in a region excluding the pixel region 110 in which the plurality of pixels 111, 113, 115, and 117 are provided. That is, the black matrix 120 is not formed at an opening, but is formed at a non-opening portion (or non-light emitting portion).

More specifically, the first panel 101 is in a rectangular shape, and the respective pixels 111, 113, 115, and 117 are arranged at the first interval L1 in top, bottom, left, and right directions to form a matrix on the first panel 101. In this case, the black matrix 120 is arranged in a portion in which the respective pixels 111, 113, 115, and 117 are not arranged. The black matrix 120 may be arranged between the respective pixels 111, 113, 115, and 117, and may also be formed on the edge portions 121, 123, 125, and 127 of the display module 100.

Because the black matrix 120 is arranged between the respective pixels 111, 113, 115, and 117, instead of between the respective sub-pixels 111a, 111b, and 111c, the flexible circuit board and the thin film transistor glass that are arranged on the panel are hidden from view. However, it is also possible for the black matrix 120 to be arranged between the respective sub-pixels 111a, 111b, and 111c to prevent the light interference between the color filters and to improve contrast of the display. In this case, the black matrix 120 is arranged between the respective pixels 111, 113, 115, and 117 at the first interval L1.

The black matrix 120 may be made of one or more selected from the group including MIHL (Metal Insulator Hybrid Layer), black polymer, and carbon black.

The edge portions 121, 123, 125, and 127 are portions that are mutually bonded to each other when respective display modules 100, 200, 300, and 400 are bonded to form a multi-display device 1000. The edge portions 121, 123, 125, and 127 may be arranged so that end portions of the pixels 111, 113, 115, and 117 and the black matrix 120 are alternately arranged, and the black matrix 120 may be arranged with a predetermined width.

The respective display modules 100, 200, 300, and 400 may be formed in a rectangular shape. Accordingly, the edge portions include the first edge portion 121, the second edge portion 123, the third edge portion 125, and the fourth edge portion 127. The first edge portion 121 indicates a left end portion of the front glass 101, and the second edge portion 123 faces the first edge portion 121 and indicates a right end portion of the front glass 101. The third edge portion 125 indicates a lower end portion of the front glass 101, and the fourth edge portion faces the third edge portion 125 and indicates an upper end portion of the front glass 101.

The respective edge portions 121, 123, 125, and 127 have widths W1, W2, W3, and W4, respectively, which are formed with predetermined lengths measured from the respective pixels 111, 113, 115, and 117 to the end portions of the respective edge portions 121, 123, 125, and 127 in a direction that is perpendicular to respective sides of the edge portions 121, 123, 125, and 127. The widths W1, W2, W3, and W4 are formed so that a sum (W1+W2, W3+W4) of the widths W1, W2, W3, and W4 between the respective edge portions 121, 123, 125, and 127 that face each other are equal to the first interval L1 between the respective pixels 111, 113, 115, and 117.

The first width W1 is a distance measured from the left end of the pixels 111 and 112 to the left end of the first edge portion 121. The second width W2 is a distance measured from the right end of the pixels 114 and 116 to the right end of the second edge portion 125. The third width W3 is a distance measured from the lower end of the pixels 112 and 114 to the third edge portion 127. The fourth width W4 is a distance measured from the upper end of the pixels 111 and 116 to the fourth edge portion 129.

In FIG. 1B, the respective edge portions 121, 123, 125, and 127 have the same width. That is, the first width W1 may be ½ of the first interval L1, and the second width W2 may be ½ of the first interval L1. Further, the third width W3 may be ½ of the first interval L1, and the fourth width W4 may be ½ of the first interval L1. FIG. 2 illustrates a multi-display device 1000 in which the configurations of FIG. 1B are bonded to each other.

FIG. 2 is a plan view illustrating the arrangement relationship and bonding relationship of main portions of the respective display modules 100, 200, 300, and 400 when the respective display modules are bonded to each other.

Referring to FIG. 2, a multi-display device 1000 includes first to fourth display modules 100, 200, 300, and 400. The respective display modules 100, 200, 300, and 400 are consecutively bonded together. The third display module 300 is bonded to the right side of the first display module 100, and the second display module 200 is bonded to the upper side of the first display module 100. Further, the fourth display module 400 is bonded to the right side of the second display module 200 and the upper side of the third display module 300.

Specifically, the second edge portion 123 of the first display module 100 is mutually bonded to a first edge portion 321 of the third display module 300, and the fourth edge portion 127 of the first display module 100 is mutually bonded to a third edge portion 225 of the second display module 200. Further, a second edge portion 223 of the second display module 200 is mutually bonded to a first edge portion 421 of the fourth display module 400, and a fourth edge portion 327 of the third display module 300 is mutually bonded to a third edge portion 425 of the fourth display module 400.

Intervals L1, L2, L3, and L4 between the respective pixels in the respective display modules 100, 200, 300, and 400 are equal to each other.

Once the respective display modules are bonded together, a sum of the second width W2 of the first display module and the first width W9 of the third display module 300, i.e., an interval between a pixel 114 and a pixel 312, is equal to the first interval L1. Further, a sum of the fourth width W4 of the first display module 100 and the third width W7 of the second display module 200, i.e., an interval between a pixel 111 and a pixel 212, is equal to the first interval L1. Further, a sum of the second width W6 of the second display module 200 and the first width W13 of the fourth display module 400, i.e., an interval between a pixel 216 and a pixel 411, is equal to the first interval L1. Further, a sum of a fourth width W12 of the third display module 300 and the third width W15 of the fourth display module 400, i.e., an interval between a pixel 316 and a pixel 414, is equal to the interval L1. Accordingly, in portions where pixels 116, 214, 311, and 412 are arranged, which correspond to portions where the four display modules 100, 2090, 300, and 400 are mutually bonded together, intervals between the respective pixels 116, 214, 311, and 412 in top, bottom, left, and right directions are equal to the first interval L1.

Accordingly, even if the respective display modules 100, 200, 300, and 400 are consecutively bonded, the intervals between the pixels are constant, and thus optimum resolution can be implemented, even in the case where a viewer is not apart from the display device 100 for a predetermined distance. Further, because the respective modules 100, 200, 300, and 400 are attached without any bezel, complete visibility can be implemented. Further, because the modularized display modules 100, 200, 300, and 400 are attached instead of attaching heavy modules, such as LEDs, workability is improved, and the structure of the multi-display device is relatively simplified to reduce power consumption.

Further, great efforts to reduce the size of the bezel have been made with the trend of implementation of a light-weighted, thin, short and small display module through reduction of the thickness of the display. In the case of implementing a large-scale display device through connection and arrangement of several display modules, as the width of the bezel becomes large, images are cut off by the bezel to cause shape distortion of the images to occur. Because the configuration does not have the bezel, the above-described problem can be minimized. That is, it becomes possible to prevent the distortion of the screen and to implement a light-weight, thin, short and small display module.

In FIG. 2, it is exemplified that four display modules 100, 200, 300, and 400 are arranged. However, more display modules may also be arranged depending on their purposes.

Figure 3:
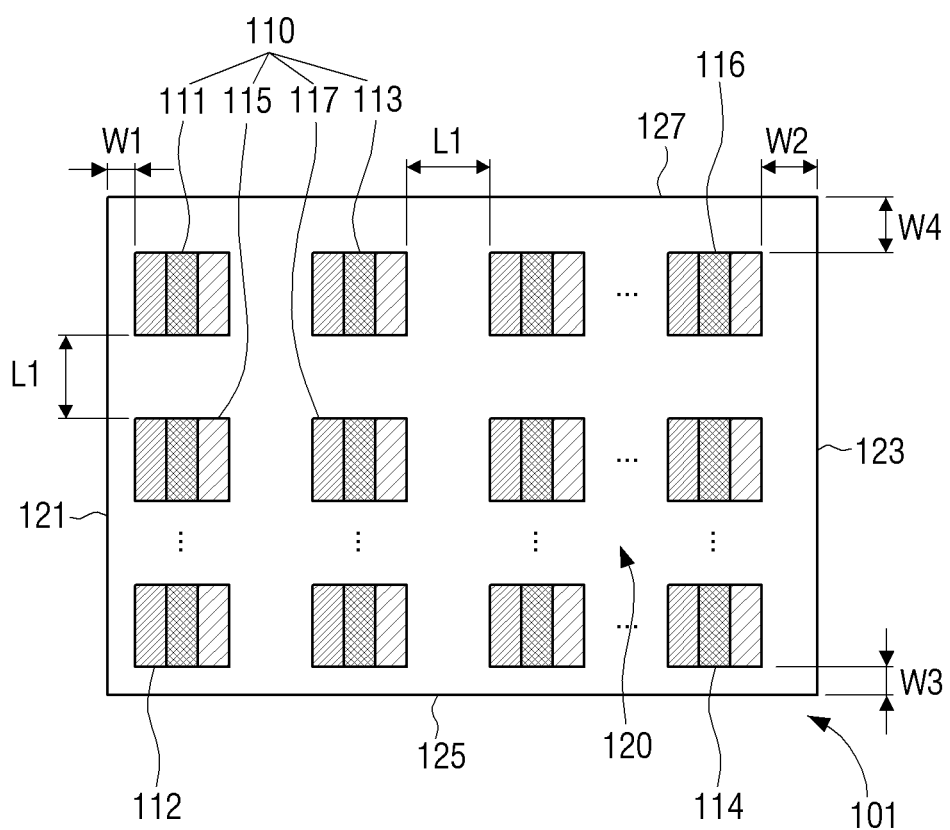
FIG. 3 is a plan view illustrating a display module according to an exemplary embodiment.

FIG. 3 is a plan view illustrating a modified example of a black matrix of a display module according to a first exemplary embodiment.

Referring to FIG. 3, a modified example of a black matrix of a display module according to the first exemplary embodiment has a mostly similar configuration as the configuration of one example of a black matrix of a display module according to the first exemplary embodiment, except that the first to fourth widths W1, W2, W3, and W4 are different from those according to the one example. In explaining the second example, similar reference numerals are used for similar constituent elements as the constituent elements according to the first example. Accordingly, the second example will be described around the configuration that is different from the configuration according to the first example.

Referring to FIG. 3, among the first to fourth edge portions 121, 123, 125, and 127, one pair of the edge portions that face each other have different widths, and the remaining pair of the edge portions that face each other may have different widths. For example, if the first width W1 is ⅓ of the first interval L1, the second width W2 is ⅔ of the first interval L1, whereas if the third width W3 is ⅓ of the first interval L1, the fourth width W4 may be ⅔ of the first interval L1. On the other hand, even if the configurations are consecutively bonded together as illustrated in FIG. 2, the intervals between all the pixels are constant.

Figure 4A:
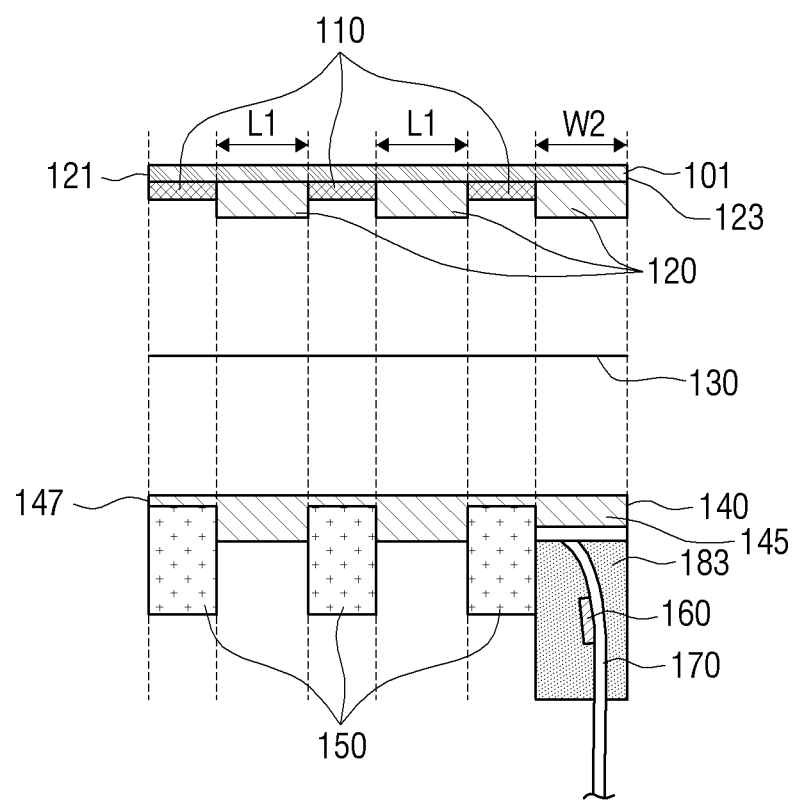
FIG. 4A is a schematic side view illustrating a display module according to an exemplary embodiment.

FIG. 4A is a schematic side view illustrating a display module according to a second exemplary embodiment.

Referring to FIG. 4A, a second exemplary embodiment has a mostly similar configuration to the first exemplary embodiment described above, except that the configuration of the black matrix 120 of the edge portions 121 and 123 is different from that according to the first exemplary embodiment. In explaining the second exemplary embodiment, similar reference numerals are used for the same or similar elements as the constituent elements according to the first exemplary embodiment. Accordingly, the second exemplary embodiment will focus on the configuration that is different from the configuration according to the first exemplary embodiment. Specifically, according to this second exemplary embodiment, a black matrix 120 is omitted from a left edge portion 121 of an OLED display module 100.

The display module 100 includes a first panel 101, a pixel region 110, a black matrix 120, an adhesive layer 130, a second panel 140, an organic light emitting diode 150, a semiconductor device 160, a flexible circuit board 170, and an opaque fixing portion 180.

In this exemplary embodiment, a first edge portion 121 does not have a black matrix 120, and the width W2 of a second edge portion 123 that includes the black matrix 120 is equal to an interval L1 between respective pixels 110. Accordingly, the width of a right end 145 of the second panel 140 is equal to the interval L1 between the respective pixels 120. Further, on the first panel 101 that corresponds to a left end 147 of the second panel 140, the black matrix 120 is not arranged, but a pixel 110 is arranged. Because the pixel 110 is arranged in a place that corresponds to the first edge portion 121 of the first panel 101, the organic light emitting diode 150 is arranged on a portion of the second panel that corresponds to the pixel 110.

Because the organic light emitting diode 150 is arranged on the left end 147 of the second panel 140, unlike the first exemplary embodiment, the second exemplary embodiment does not require a sealant 180 that is spread on the left end 147. However, in the case where the display module 100 having a right end 145 on which the sealant 180 is spread only functions as the outermost display module, it is also possible to completely intercept light leakage through spreading of the thin opaque fixing portion 180 at the left end 147.

Figure 4B:
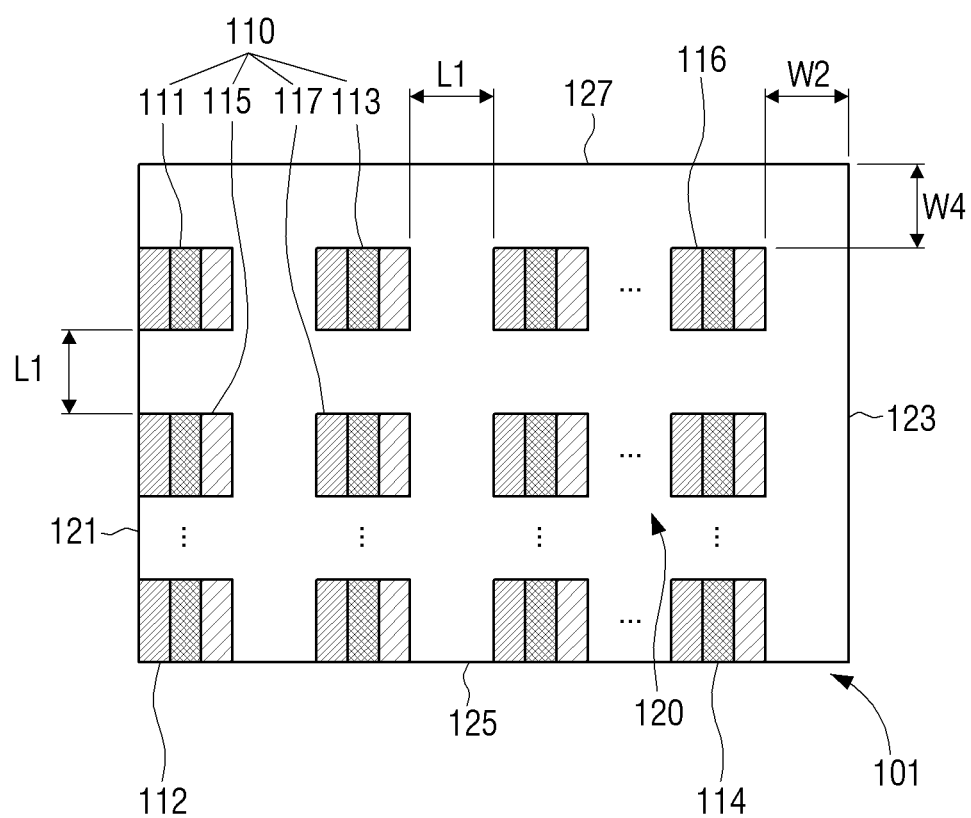
FIG. 4B is a plan view illustrating a display module according to an exemplary embodiment.

FIG. 4B is a plan view illustrating an example of a black matrix of a display module according to a second exemplary embodiment. FIG. 4B illustrates a configuration that corresponds to an arrangement of the pixel region 110 and the black matrix 120 of the first panel 101 of FIG. 4A.

The configuration of FIG. 4B is mostly similar to the configuration of FIG. 1B, but first to fourth widths W1, W2, W3, and W4 are different from those of the configuration of FIG. 1B. Accordingly, the configuration of FIG. 4B will be described around the differences from that of the configuration of FIG. 1B.

Referring to FIG. 4B, among the first to fourth edge portions 121, 123, 125, and 127, one pair of the edge portions that face each other have different widths, and the remaining pair of the edge portions that face each other have different widths. In this case, among the respective edge portions 121, 123, 125, and 127, the width of any one of the one pair of the edge portions that face each other is zero, and the width of any one of the remaining pair of the edge portions that face each other is zero. That is, if the first width W1 is zero, the second width W2 may be equal to the first interval L1, while if the third width W3 is zero, the fourth width W4 may be equal to the first interval L1. On the other hand, even if the configurations of FIG. 4B are consecutively bonded together as illustrated in FIG. 2, the intervals between all the pixels are constant.

Figure 5:
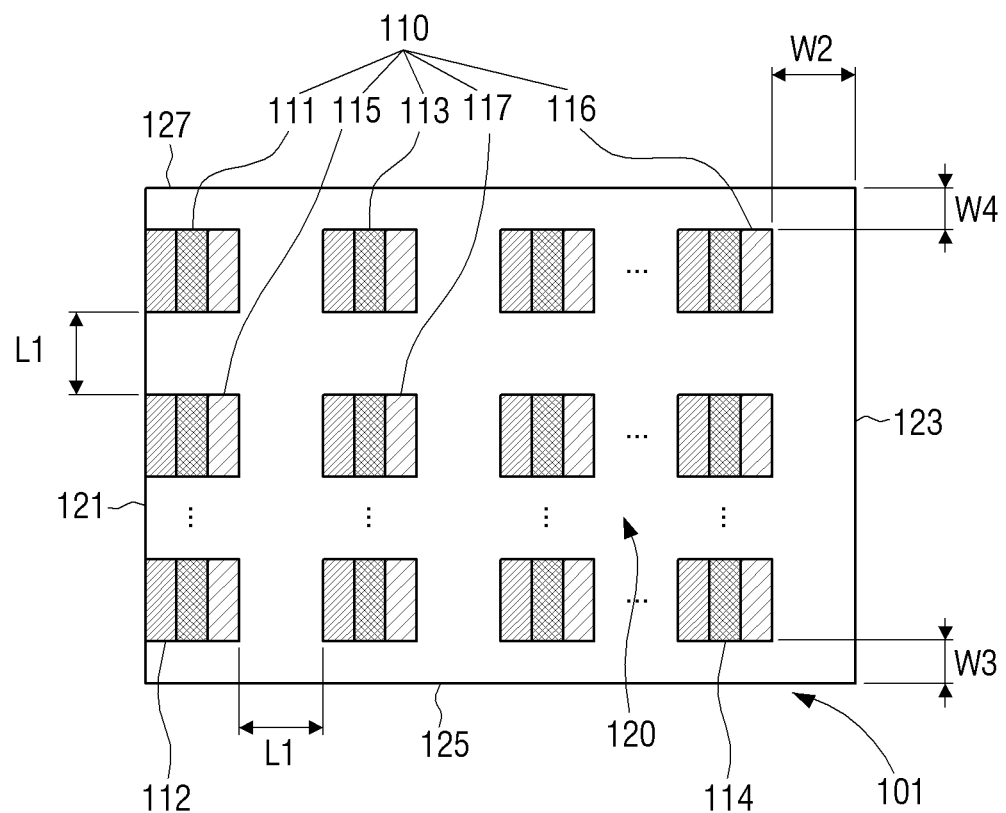
FIG. 5 is a plan view illustrating a display module according to an exemplary embodiment.

FIG. 5 is a plan view illustrating a first modified example of a black matrix of a display module according to a second exemplary embodiment. FIG. 5 illustrates a modified example of the configuration that corresponds to an arrangement of the pixel region 110 and the black matrix 120 of the first panel 101 of FIG. 4A.

The configuration of FIG. 5 is mostly similar to the configuration of FIG. 4B, but second to fourth widths W2, W3, and W4 are different from those of the configuration of FIG. 4B. Accordingly, FIG. 5 will be described referencing the differences compared to the configuration of FIG. 4B.

Referring to FIG. 5, among the first to fourth edge portions 121, 123, 125, and 127, one pair of the edge portions that face each other have the same width, and the remaining pair of the edge portions that face each other have different widths. In this case, the width of any one of the one pair of the edge portions having different widths may be 0. That is, if the first width W1 is zero, the second width W2 may be equal to the first interval L1, while if the third width W3 is ½ of the first interval L1, the fourth width W4 may also be ½ of the first interval L1. On the other hand, even if the configurations of FIG. 5 are consecutively bonded together as illustrated in FIG. 2, the intervals between all the pixels remain constant.

Figure 6:
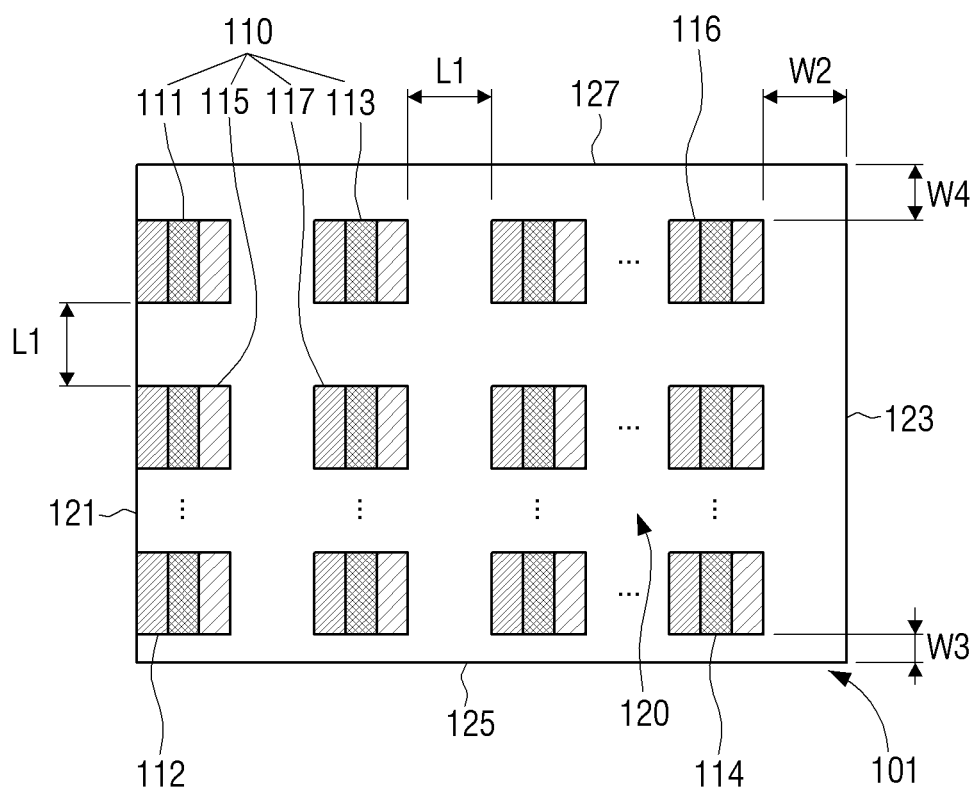
FIG. 6 is a plan view illustrating a display module according to an exemplary embodiment.

FIG. 6 is a plan view illustrating a second modified example of a black matrix of a display module according to a second exemplary embodiment. FIG. 6 illustrates a modified example of the configuration that corresponds to an arrangement of the pixel region 110 and the black matrix 120 of the first panel 101 of FIG. 4A.

The configuration of FIG. 6 is mostly similar to the configuration of FIG. 4B, but third and fourth widths W3 and W4 are different from those of the configuration of FIG. 4B. Accordingly, the configuration of FIG. 6 will be described around the portion that is different from that of the configuration of FIG. 4B.

Referring to FIG. 6, the first to fourth edge portions 121, 123, 125, and 127 have different widths. In this case, the width of any one of the first to fourth edge portions 121, 123, 125, and 127 is zero. That is, for example, if the first width W1 is zero, the second width W2 may be equal to the first interval L1, while if the third width W3 is ⅓ of the first interval L1, the fourth width W4 may be ⅔ of the first interval L1. On the other hand, even if the configurations of FIG. 6 are consecutively bonded together as illustrated in FIG. 2, the intervals between all the pixels remain constant.

On the other hand, if the first width W1 and the third width W3 are ¼ of the first interval L1, the second width W2 and the fourth width W4 are ¾ of the first interval L1. That is, through dividing of the respective widths by a natural number, a sum of the widths between the respective edge portions 121, 123, 125, and 127 that face each other may be equal to the first interval between the respective pixels.

Further, the respective display modules 100, 200, 300, and 400 of the multi-display device 1000 may be formed in the same pattern. However, any configuration can be used so far as the second interval (i.e., a sum of the widths of any two of the adjacent first to fourth widths W1, W2, W3, and W4) between adjacent pixels 116, 214, 311, and 412 in top, bottom, left, and right directions in adjacent portions of the respective display modules 100, 200, 300, and 400 are equal to the first interval L1.

Figure 7A:
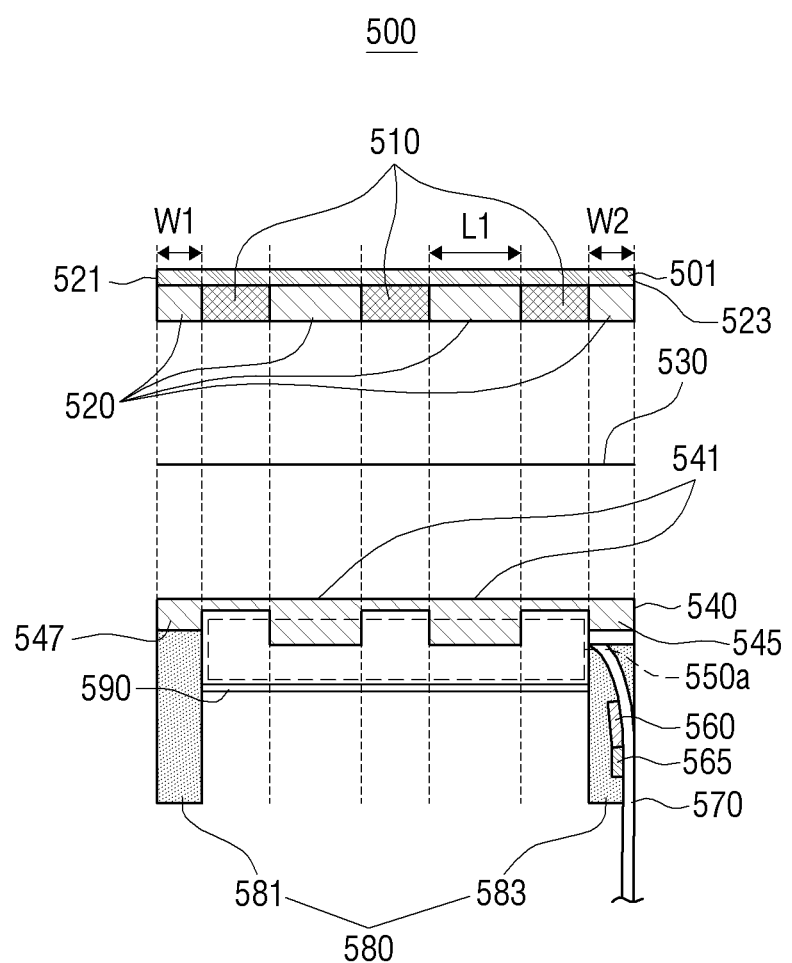
FIG. 7A is a schematic side view illustrating a display module according to an exemplary embodiment.
Figure 7B:
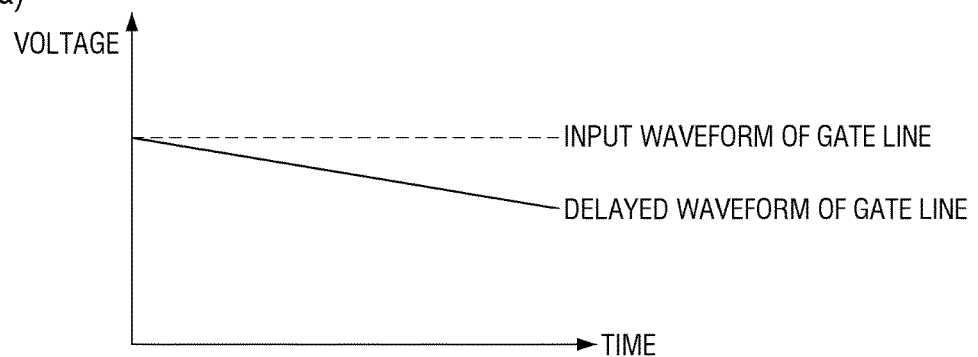
FIG. 7B is a waveform diagram of a gate signal of which the signal delay is compensated for according to an exemplary embodiment.
Figure 7B:
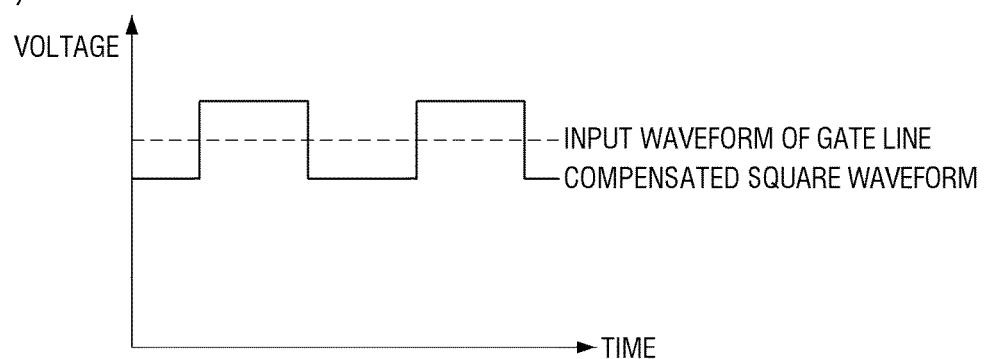

FIG. 7A is a schematic side view illustrating a display module according to a third exemplary embodiment, and FIG. 7B is a waveform diagram of a gate signal of which the signal delay is compensated for according to a third exemplary embodiment. FIGS. 7A and 7B illustrate an exemplary embodiment including an LCD (Liquid Crystal Display).

The LCD is an electronic device that converts various pieces of electrical information occurring in various kinds of devices into visual information to transfer the converted visual information using a change of permeability of liquid crystals according to an applied voltage. The display device including the LCD includes a color filter as its constituent element. The LCD display may be variously configured according to the color filter and a light source, and aspects will be described with reference to a schematic side view that corresponds to the OLED display of FIGS. 1A and 4A.

Referring to FIG. 7A, a display module 500 includes a first panel 501, a pixel region 510, a black matrix 520, an adhesive layer 530, a second panel 540, a first liquid crystal layer 550a, a semiconductor device (driver IC) 560, a compensation circuit 565, a flexible circuit board 570, an opaque fixing portion 580, and a protection glass 590.

A third exemplary embodiment has a similar configuration to the configuration of the first exemplary embodiment except for the liquid crystal layer 550a. In explaining the third exemplary embodiment, similar reference numerals are used for similar constituent elements as the constituent elements according to the first exemplary embodiment. The third exemplary embodiment will be described around the configuration that is different from the configuration according to the first exemplary embodiment.

The first liquid crystal layer 550a is arranged between the second panel 540 and the protection glass 590. Liquid crystals of the first liquid crystal layer 550a are in a liquid crystal state that is an intermediate state between a solid state and a liquid state, and the light transmission of the liquid crystals is changed in accordance with a voltage applied thereto. Because the first liquid crystal layer 550a is filled with the liquid crystals in the liquid crystal state, it has a predetermined thickness. The protection glass 590 is arranged on upper and lower portions of the first liquid crystal layer 550a to protect the first liquid crystal layer 550a. Further, a polarizing plate is arranged on the upper and lower portions of the first liquid crystal layer 550a. The polarizing plate may be a film that obtains linear polarization. For example, the film may use the property that optical isomer has polarized transmitted light with different colors according to its direction.

In the third exemplary embodiment, the first liquid crystal layer 550a is formed in a direction that is opposite to the direction that is directed to the first panel 501.

According to the LCD display module, the respective constituent elements of the second panel 540 are formed in the direction that is directed to the first panel 501, and the flexible circuit board 570 is attached in a direction that faces the first panel 501. In this structure, a bezel for hiding the flexible circuit board 570 and the driver IC 560 is attached thereto. In the display module 500 the organic light emitting diode 550 is attached to the second panel 540, the semiconductor device (driver IC) 560, the compensation circuit 565, the flexible circuit board 570, and wirings are not formed in a direction that is directed to the first panel 501, but are formed in an opposite direction to the direction that is directed to the first panel 101. Accordingly, the semiconductor device (driver IC) 560, the compensation circuit 565, and the flexible circuit board 570 are hidden by the black matrix 520 of the edge portion 523 of the first panel 501, and thus the bezel is not necessary.

In the third exemplary embodiment, like the second exemplary embodiment of FIG. 2A, on the first panel 501 that corresponds to the left end 547 of the second panel 540, the black matrix 520 may not exist, but the pixel 510 may exist. In this case, in a manner similar to the second exemplary embodiment, it is not necessary to spread the opaque fixing portion 580 on the left end 547, but it is also possible to spread the opaque fixing portion 580 to completely intercept light leakage.

The display module according to the third exemplary embodiment further includes the compensation circuit 565. The compensation circuit 565 is mounted on the flexible circuit board 570. The compensation circuit 565 may be mounted on the surface or the rear surface of the flexible circuit board 570, which is the same surface as the surface on which the semiconductor device 560 is mounted.

In the liquid crystal display (LCD), the permeability of a liquid crystal material that is injected between electrodes of two layers is controlled by a difference between voltages applied to the two electrodes to implement the display. The semiconductor device (driver IC) 560 that includes a gate driver IC or a source driver IC is connected to the second panel 540, and a gate voltage and a data voltage are supplied to the second panel 540 through the semiconductor device 560. In arranging the semiconductor device 560, there exist a single band structure in which the semiconductor device 560 is arranged on only one side of the second panel 540 and a dual bank structure in which two semiconductor devices 560 are arranged on both sides of the second panel 540.

According to the third exemplary embodiment, in the case of consecutively bonding the display modules 500, a single bank structure may be adopted to minimize interference between the respective constituent elements. Further, the single bank structure may be adopted to simplify the structure of the display module 500 through reduction of the area occupied by the semiconductor device 560 and to reduce the manufacturing cost. However, in the case of the LCD display module 500 having the single bank structure, due to the self-resistance component and parasitic capacitance that exist in the gate driver IC, signal delay may occur in the semiconductor device 560 that includes the gate driver IC.

In the third exemplary embodiment, the compensation circuit 565 is a circuit that compensates for the above-described signal delay, which may be gate time delay. To compensate for distortion due to the signal delay, the compensation circuit 565 includes a delay compensation element connected to one side of the gate driver IC and a compensated voltage transfer line connected to the delay compensation element. Further, it is also possible to compensate for the distortion due to the signal delay through applying of a voltage having a predetermined waveform as a counter electrode voltage even if the signal delay occurs in the gate driver IC.

FIG. 7B is a waveform diagram of a gate signal of which the signal delay is compensated for according to a third exemplary embodiment.

In FIG. 7B, (a) indicates a delayed waveform of the gate line against an input waveform of the gate line through adoption of the single bank structure. The signal delay aggravates the charging characteristic of the respective pixels in the LCD display module 500 to cause a difference between charged voltages in the respective pixels to occur. Further, the signal delay causes DC stress and afterimage problems in the liquid crystal material, resulting in deteriorated picture quality.

As indicated as (b) in FIG. 7B, in order to compensate for the existing waveform, a voltage having a square waveform is applied through the compensation circuit 565 in consideration of the gate time delay, and thus the signal delay of the gate driver IC can be compensated for. Accordingly, the pixel voltage difference between the respective pixels can be minimized and thus picture quality difference between the pixels and the afterimage problems can be solved.

Figure 8:
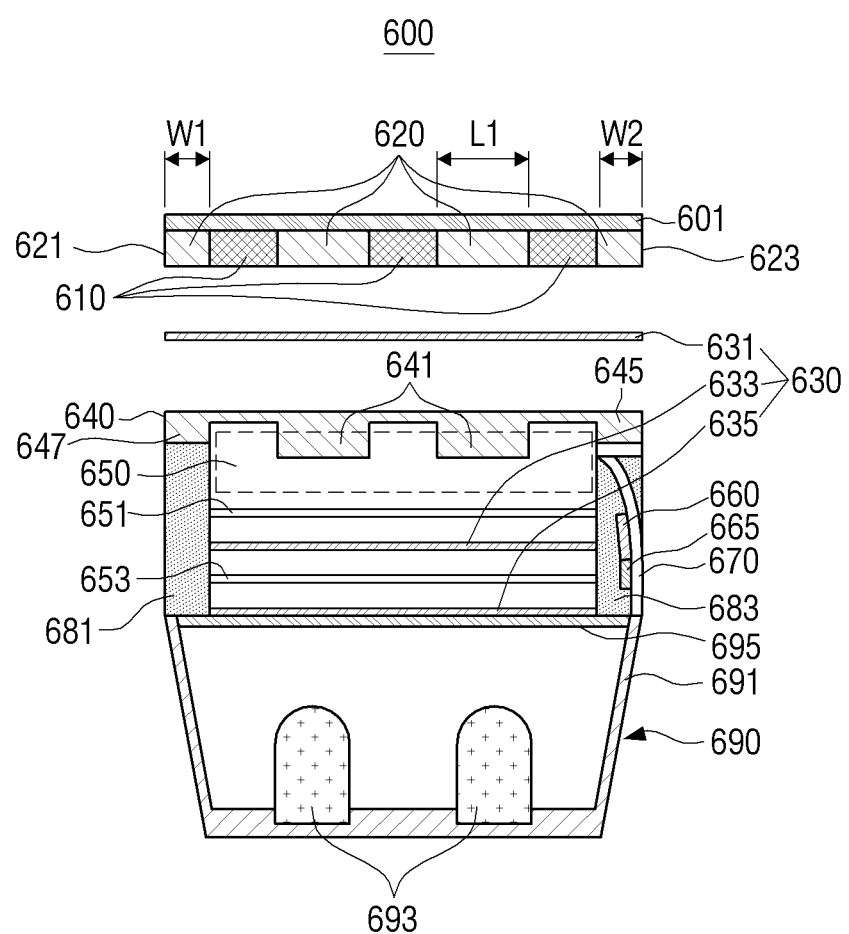
FIG. 8 is a schematic side view illustrating a first support structure of a display module according to an exemplary embodiment.

FIG. 8 is a schematic side view illustrating a first support structure of a display module according to a third exemplary embodiment.

Referring to FIG. 8, a first support structure of a display module mostly similar to the configuration according to the third exemplary embodiment, and further includes a light source portion 690. In describing the first support structure of the display module, the reference numerals that correspond to the third exemplary embodiment are given to similar constituent elements as those according to the third exemplary embodiment. The first support structure of the display module will be described around the configuration that is different from that according to the third exemplary embodiment. A liquid crystal layer 650 of the first support structure of the display module may be the first liquid crystal layer 550a according to the third exemplary embodiment or the first liquid crystal layer 550b according to the fourth exemplary embodiment.

Because an LCD display module 600 is not a self-luminous device, a separate light source may be implemented, and for this, the light source portion 690 is provided on the rear surface of a second panel 641 to supply light.

The light source portion 690 includes a bottom chassis 691, a light source 693, and an upper bottom chassis 695.

The bottom chassis 691 is to bond and affix inner constituent elements of the display module 600, i.e., first and second panels 601 and 640, and an optical sheet. Through the bottom chassis 691, the display module 690 becomes stable in structure, and has stiffness and strength. On the bottom of the bottom chassis 691, a reinforcement member or an assembly member is formed to bond and fix the respective display modules 600.

The light source 693 may be an edge type or a direct type, and the first support structure of the display module exemplifies a direct type configuration. According to the direct type, a plurality of light sources 693 are directly arranged on the rear surface of the second panel 640 to emit light incident to the second panel 640. The light source 693 may be a cathode fluorescent lamp or an external electrode fluorescent lamp. Further, in addition to such a fluorescent lamp, light emitting diodes (LEDs) may be used.

The upper bottom chassis 695 is a diffusion layer that is formed to diffuse light emitted from the light source portion 690, and to supply the diffused light to the first and second panels 601 and 640 positioned on an upper portion thereof.

In the first support structure of the display module, an adhesive layer 631 is arranged between the first panel 601 and the second panel 640. Further, an adhesive layer 633 is arranged between a protection glass 651 and an optical sheet 653. Further, an adhesive layer 635 is arranged between the optical sheet 653 and the upper bottom chassis 695. The adhesive layer 630 may be made of OCA (Optical Clear Adhesive), but is not limited thereto. Any configuration can be used so far as it can attach films or panels to each other.

In the display device in the related art, panels and optical sheets are fixed to a bottom chassis, and upper portions thereof are fixed using a top chassis. Accordingly, a bezel is defined by the top chassis. Because the panels 601 and 640, the protection glass 651, and the optical sheet 653 are fixed and bonded to the bottom chassis 695 and the diffusion layer using the adhesive layer 630, the top chassis becomes unnecessary. Further, the light leakage through a left end 647 of the second panel 640 that corresponds to a first edge portion 621 and a right end 645 of the second panel 640 that corresponds to a second edge portion 623 can be prevented using opaque fixing portions 681 and 683. Through this configuration, it becomes possible to implement a display module 600 having no bezel.

On the other hand, in the case of the first support structure of the display module, like the second exemplary embodiment of FIG. 2A, on the first panel 601 that corresponds to the left end 647 of the second panel 640, a black matrix 620 may not exist, but a pixel 610 may exist. In this case, in a manner similar to the second exemplary embodiment, it is not necessary to spread an opaque fixing portion 680 on the left end 647. Accordingly, the opaque fixing portion 680 is spread only on the right end 645 to fix and support a driver IC 660 and a flexible circuit board 670, and light leakage to the side surface of the display module 600 can be prevented. However, in the case where the display module 600 having the right end 645 on which the opaque fixing portion 680 is spread only functions as the outermost display module, it is also possible to completely intercept light leakage through spreading of the thin opaque fixing portion 680, such as a sealant, at the left end 647.

Figure 9:
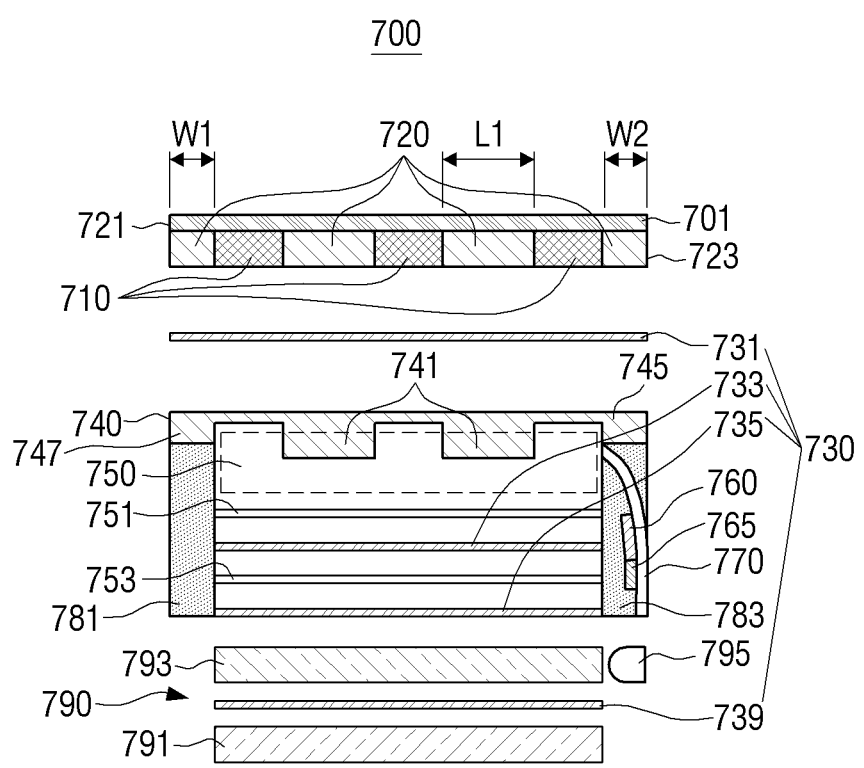
FIG. 9 is a schematic side view illustrating a second support structure of a display module according to an exemplary embodiment.

FIG. 9 is a schematic side view illustrating a second support structure of a display module according to a third exemplary embodiment.

Referring to FIG. 9, the second support structure of the display module has a mostly similar configuration as the configuration of the first support structure of the display module as described above, except for a configuration of a light source portion 790. In explaining the second support structure of the display module, similar reference numerals are used for similar constituent elements as the constituent elements of the first support structure of the display module. The second support structure of the display module will be described around the configuration that is different from the configuration of the first support structure of the display module. A liquid crystal layer 750 of the second support structure of the display module may be the first liquid crystal layer 550a according to the third exemplary embodiment, or the first liquid crystal layer 550b according to the fourth exemplary embodiment.

The display module 700 according to the second support structure of the display module is a configuration having an edge type light source portion 790. The light source portion 790 includes a bottom chassis 791, a light guide plate 793, and a light source 795.

Unlike the first support structure of the display module, the bottom chassis 791 is in a plate shape. Because the configuration and effect of the bottom chassis 791 are similar to those of the first support structure of the display module, the detailed explanation thereof will be omitted.

The light guide plate 793 is made of, for example, an acrylic resin, such as poly(methyl methacrylate), or poly (methyl styrene), and uniformly supply light that is emitted from a light emitting diode 795 to a diffusion film provided on an upper portion of the light guide plate 793.

An adhesive layer 739 is provided between the light guide plate 793 and the bottom chassis 791 to attach the light guide plate 793 and the bottom chassis 791 to each other. Further, an adhesive layer 735 is provided between the light guide plate 793 and an optical sheet 753 to attach them to each other.

In the second support structure of the display module, because panels 701 and 740, a protection glass 751, and the optical sheet 753 are fixed and bonded to the bottom chassis 791 and the light guide plate 793 using the adhesive layer 730, a top chassis becomes unnecessary. Further, the light leakage through a left end 747 of the second panel 740 that corresponds to a first edge portion 721 and a right end 745 of the second panel 740 that corresponds to a second edge portion 723 can be prevented using opaque fixing portions 781 and 783. Through this configuration, it becomes possible to implement a display module 700 having no bezel.

On the other hand, in the case of the second support structure of the display module, like the second exemplary embodiment of FIG. 2A, on the first panel 701 that corresponds to the left end 747 of the second panel 740, a black matrix 720 may not exist, but a pixel 710 may exist. In this case, in a similar manner as the second exemplary embodiment, it is not necessary to spread an opaque fixing portion 780 on the left end 747. Accordingly, the opaque fixing portion 783 is spread only on the right end 745 to fix and support a driver IC 760 and a flexible circuit board 770, and light leakage to the side surface of the display module 700 can be prevented. However, in the case where the display module 700 having the right end 745 on which the opaque fixing portion 780 is spread only functions as the outermost display module, it is also possible to completely intercept light leakage through spreading of the thin opaque fixing portion 780, such as a black sealant, at the opposite left end.

Figure 10:
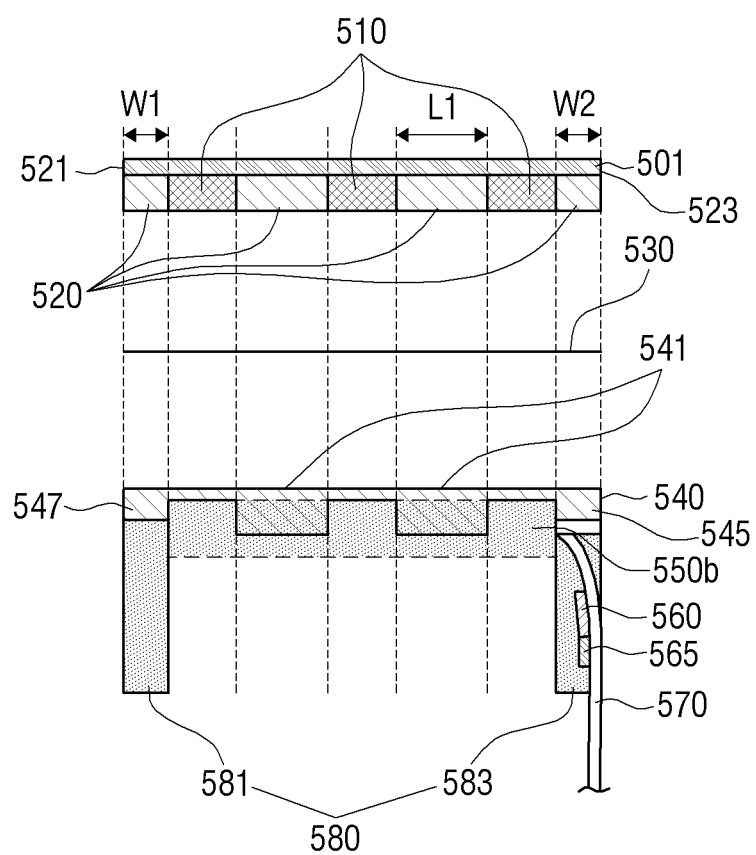
FIG. 10 is a schematic side view illustrating a display module according to an exemplary embodiment.

FIG. 10 is a schematic side view illustrating a display module according to a fourth exemplary embodiment.

Referring to FIG. 10, a fourth exemplary embodiment has a mostly similar configuration as the configuration of the third exemplary embodiment except for a second liquid crystal layer 550*b*. In explaining the fourth exemplary embodiment, similar reference numerals are used for similar constituent elements as the constituent elements according to the third exemplary embodiment. The fourth exemplary embodiment will be described around the configuration that is different from the configuration according to the third exemplary embodiment.

The second liquid crystal layer 550*b* is provided by coating a lower surface of the second panel 540 with nano-liquid crystals. The second liquid crystal layer 550*b* displays an image in a manner that nanocapsules that are filled with irregularly arranged nematic liquid crystal molecules are dispersed onto a buffer layer to change an amount of light transmission of the second liquid crystal layer 550*b*. The second liquid crystal layer 550*b* is made of isotropic liquid crystals. If a voltage is not applied thereto, the second liquid crystal layer 550*b* becomes optically isotropic, whereas if an electric field is applied thereto, double refraction occurs only in the corresponding direction. Further, a polarizing plate is arranged on upper and lower portions of the second liquid crystal layer 550*b*.

Because an initial alignment having optical anisotropy does not exist in the second liquid crystal layer 550*b*, alignment is not necessary, and thus it is not necessary to provide an alignment layer in the display module 500. Further, it is not required to perform a rubbing process, and thus efficiency of the processing can be improved.

Further, because the second liquid crystal layer 550*b* has a thickness that is smaller than the thickness of the first liquid crystal layer 550*a*, a compact display module 500 can be implemented. Further, it is not necessary to provide a protection glass 590 that prevents leakage of liquid crystals, and thus materials in processing can be saved.

Further, it is not necessary to protect the second liquid crystal layer 550*b* with a filler for filling side surfaces of the first panel 501 and the second panel 540, and thus an additional configuration for hiding the filler is not necessary.

In a manner similar to the third exemplary embodiment, the first support structure (see FIG. 8) or the second support structure (see FIG. 9) may be provided in the fourth exemplary embodiment. In this case, the liquid crystal layer 750 of the second support structure of the display module may become the second liquid crystal layer 550*b*.

Figure 11:
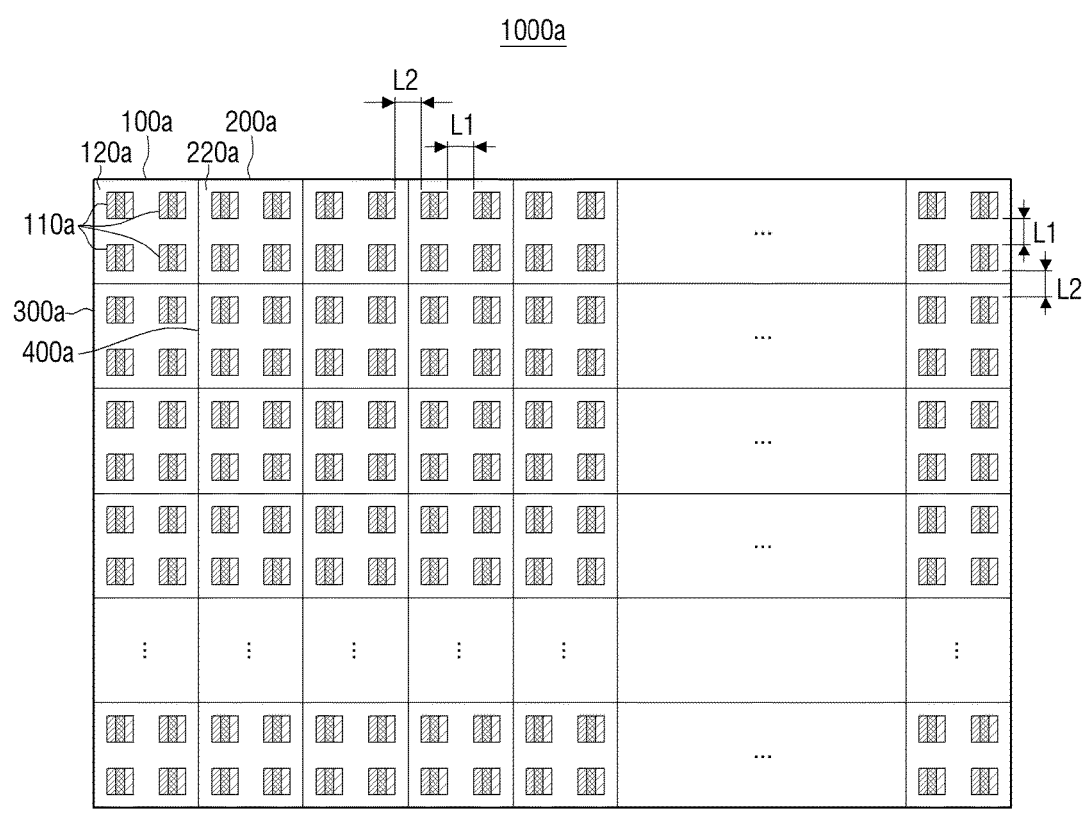
FIG. 11 is a view illustrating a multi-display device according to an exemplary embodiment.

FIG. 11 is a view illustrating an example of a multi-display device that is manufactured as a plane.

FIG. 11 illustrates a planar multi-display device 1000*a* in which display modules 100*a* to 400*a* are bonded together.

In the planar multi-display device 1000*a*, the display modules 100*a* to 400*a* are consecutively bonded and fixed by a bracket. In the case of bonding the plurality of display modules 100*a* to 400*a* through the bracket, the display modules 100*a* to 400*a* are arranged without any interval between them.

Several to several hundred or more of planar multi-display devices 1000*a* may be arranged to create a large display. In the case of bonding the respective display modules 100*a* to 400*a*, the interval L2 between adjacent pixels is equal to the interval L1 between pixels 110*a*.

Accordingly, even in the case of boding the plurality of display modules 100*a* to 400*a*, it is possible to implement the configuration having no bezel. Accordingly, as the width of the bezel becomes larger in the multi-display device, image distortion that occurs due to cutoff of the image by the bezel can be prevented, and a compact display device 1000*a* can be implemented. Further, the manufacturing cost, power consumption, and complexity of the module configuration can be reduced in comparison to those in the related art.

Figure 12:
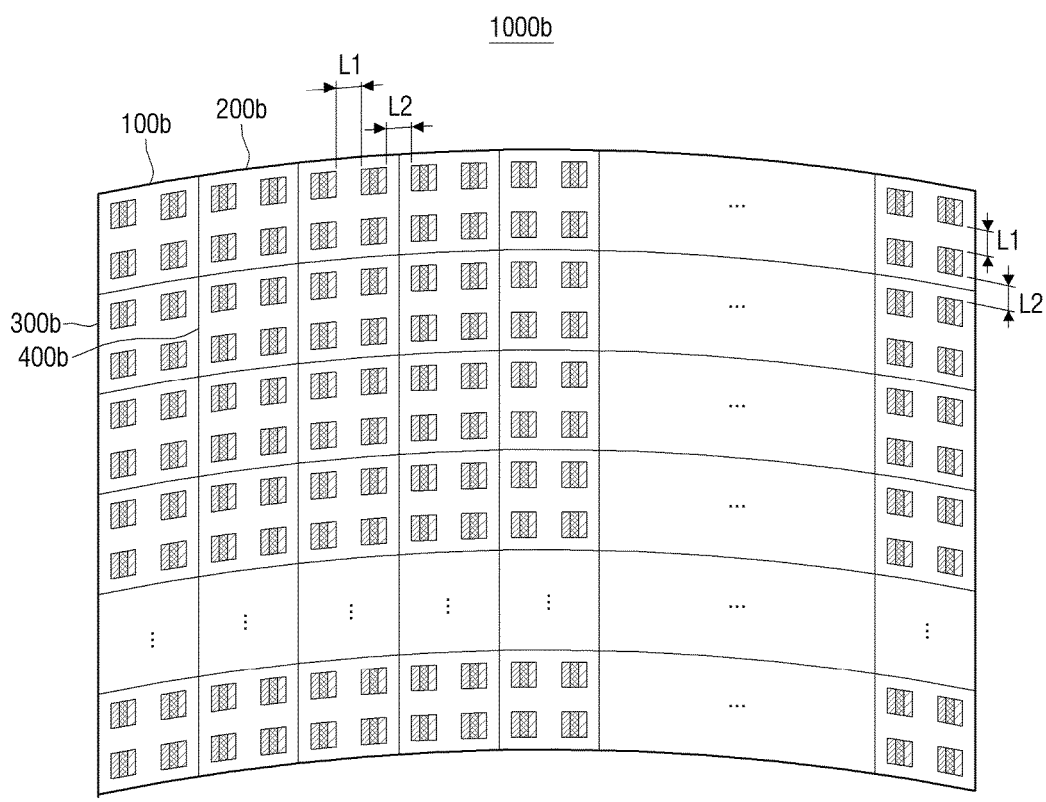
FIG. 12 is a view illustrating a multi-display device according to an exemplary embodiment.

FIG. 12 is a view illustrating an example of a multi-display device that is manufactured as a curve.

Referring to FIG. 12, a curved multi-display device 1000*b* has a mostly similar configuration as the configuration of the third exemplary embodiment except for a curved display screen. In explaining the curved multi-display device 1000*b*, similar reference numerals are used for similar constituent elements as the constituent elements of the planar multi-display device 1000*a*.

The curved multi-display device 1000*b* is a display device in which a plurality of display modules 100*b* to 400*b* are bonded to form a curve having a predetermined curvature. According to the curved display device, a wide viewing angle is achieved, and light reflection on the screen is reduced.

In the curved multi-display device 1000*b*, the display modules 100*b* to 400*b* are consecutively bonded and fixed by a bracket.

The planar and curved multi-display devices 1000*a* and 1000*b* as described above can divide a single image into images to be transmitted to the respective display modules 100*a* to 400*a* and 100*b* to 400*b* through a control portion and transmit the corresponding images to the respective display modules 100a to 400a and 100b to 400b. Because the control portion of the multi-display devices 1000a and 1000b and its operation are general, the detailed explanation thereof will be omitted.

While exemplary embodiments have been shown and described, it will be understood by those skilled in the art that various changes in form and detail may be made therein without departing from the spirit and scope of the present disclosure, as defined by the appended claims.

What is claimed is:

1. A display module comprising a rectangular shape comprising a left edge, a right edge, a top edge and a bottom edge, the display module comprising:
    a panel comprising a pixel region and a black matrix, the pixel region comprising a plurality of pixels configured to emit light from an upper side of the panel, and the black matrix being arranged outside the pixel region;
    a flexible circuit board arranged to be spaced apart from the black matrix, directly under the black matrix, and comprising a surface substantially perpendicular to a display surface of the display module; and
    a fixing portion joining the flexible circuit board to a lower side of the panel, the fixing portion being directly connected to a pixel of the plurality of pixels,
    wherein each of the plurality of pixels is separated from corresponding adjacent pixels by a first distance,
    a left distance from the left edge to a first one of the plurality of pixels plus a right distance from a second one of the plurality of pixels to the right edge is the first distance,
    a bottom distance from the bottom edge to a third one of the plurality of pixels plus a top distance from a fourth one of the plurality of pixels to the top edge is the first distance, and
    a width of the fixing portion corresponds to a width of the black matrix.

2. The display module as claimed in claim 1, wherein the left distance, the right distance, the bottom distance and the top distance are equal to each other.

3. The display module as claimed in claim 1, wherein:
    the left and the right distances are the same, the bottom and the top distances are different, or
    the bottom and the top distances are the same, and the left and the right distances are different.

4. The display module as claimed in claim 3, wherein at least one of the left distance, the right distance, the bottom distance and the top distance is zero.

5. The display module as claimed in claim 1, wherein:
    the left distance and the right distance are different, or
    the bottom distance and the top distance are different, and
    a remaining pair of distances are different.

6. The display module as claimed in claim 5, wherein two distances of the left distance, the right distance, the bottom distance and the top distance are zero.

7. The display module as claimed in claim 6, wherein the left distance is zero.

8. The display module as claimed in claim 1, wherein each of the left distance, the right distance, the bottom distance and the top distance are different.

9. The display module as claimed in claim 8, wherein one of the left distance, the right distance, the bottom distance and the top distance is zero.

10. A display module comprising:
    a first panel comprising a pixel region and a black matrix forming a display surface, the pixel region comprising a plurality of pixels configured to emit light from an upper side of the first panel and the black matrix being arranged outside the pixel region;
    a second panel arranged on a lower side of the first panel, the second panel comprising a plurality of thin film transistors;
    a semiconductor device disposed on a surface of a flexible circuit board, the flexible circuit board being arranged to be spaced apart from the black matrix, directly under the black matrix, electrically connected to a lower side of the second panel and the surface of the flexible circuit board being substantially perpendicular to the display surface; and
    a fixing portion joining the flexible circuit board to the second panel and the semiconductor device to the flexible circuit board, the fixing portion being directly connected to a pixel of the plurality of pixels,
    wherein each of the plurality of pixels is separated from corresponding adjacent pixels by a first distance,
    the display module comprises a left edge portion, a right edge portion, a top edge portion and a bottom edge portion,
    a left distance from the left edge portion to a first one of the plurality of pixels plus a right distance from a second one of the plurality of pixels to the right edge portion is the first distance,
    a bottom distance from the bottom edge portion to a third one of the plurality of pixels plus a top distance from a fourth one of the plurality of pixels to the top edge portion is the first distance, and
    a width of the fixing portion corresponds to a width of the black matrix.

11. The display module as claimed in claim 10, further comprising at least one of a liquid crystal layer and an organic light emitting diode (OLED) layer arranged on a lower side of the second panel.

12. The display module as claimed in claim 11, wherein a size of the flexible circuit board corresponds to the width of the black matrix.

13. The display module as claimed in claim 12, wherein the fixing portion is an opaque fixing member, and
    wherein the surface of the flexible circuit board is affixed to the opaque fixing member.

14. The display module as claimed in claim 13, wherein the opaque fixing member is disposed directly behind the black matrix.

15. The display module as claimed in claim 11, further comprising a compensation circuit disposed on the flexible circuit board.

16. The display module as claimed in claim 11, further comprising:
    a protection glass arranged on a lower surface of the liquid crystal layer; and
    a compensation circuit on one side of the semiconductor device.

17. The display module as claimed in claim 10, further comprising a liquid crystal layer formed by coating a lower surface of the second panel with capsule-shaped nano-liquid crystals; and
    a compensation circuit disposed on the flexible circuit board.

18. The display module as claimed in claim 10, further comprising:
    a liquid crystal layer; and
    a backlight arranged on a lower side of the liquid crystal layer,
    wherein the backlight is of a direct type or an edge type.

19. A multi-display device comprising a plurality of display modules bonded to each other to form a display surface, each of the plurality of display modules comprising:
   a first panel comprising a pixel region in which a plurality of pixels are provided and a black matrix arranged outside the pixel region;
   a second panel arranged on a lower side of the first panel, the second panel comprising a plurality of thin film transistors;
   a flexible circuit board arranged to be spaced apart from the black matrix, directly under the black matrix and comprising a surface substantially perpendicular to the display surface of the multi-display device; and
   a fixing portion joining the flexible circuit board to the second panel, the fixing portion being directly connected to a pixel of the plurality of pixels,
   wherein each of the plurality of pixels is separated from corresponding adjacent pixels by a first distance,
   each of the plurality of display modules comprises a left edge portion, a right edge portion, a top edge portion and a bottom edge portion,
   a left distance from the left edge portion to a first one of the plurality of pixels plus a right distance from a second one of the plurality of pixels to the right edge portion is the first distance,
   a bottom distance from the bottom edge portion to a third one of the plurality of pixels plus a top distance from a fourth one of the plurality of pixels to the top edge portion is the first distance, and
   a width of the fixing portion corresponds to a width of the black matrix.

20. The multi-display device as claimed in claim 19, wherein the plurality of display modules form a curve.

21. The multi-display device as claimed in claim 19, wherein the fixing portion is an opaque fixing portion and the opaque fixing portion is interposed between pixels of a first display module of the plurality of display modules and pixels of a second display module of the plurality of display modules.

\* \* \* \* \*